United States Patent [19]

Berglund et al.

[11] Patent Number: 5,250,165

[45] Date of Patent: Oct. 5, 1993

[54] CONTROLLED ISOTROPY REACTIVE ION ETCHER FOR MULTI-STEPPED SLOPED CONTACT ETCH PROCESS

[75] Inventors: Robert Berglund, Mesa, Ariz.; Karl Mautz; Jonathan C. Dahm, both of Austin, Tex.

[73] Assignee: Motorola, Inc., Schaumburg, Ill.

[21] Appl. No.: 803,827

[22] Filed: Dec. 9, 1991

[51] Int. Cl.⁵ .............................................. C23C 15/00
[52] U.S. Cl. ........................... 204/192.32; 204/298.34; 156/345; 156/643; 156/644; 156/646; 156/651; 156/657; 156/659.1
[58] Field of Search .................... 204/192.32, 192.35, 204/298.31, 298.34; 156/643, 644, 646, 651, 345, 657, 659.1; 437/195, 203, 237, 241

[56] References Cited

U.S. PATENT DOCUMENTS

| 4,298,443 | 11/1981 | Maydan | 204/298.34 X |
| 4,698,128 | 10/1987 | Berglund et al. | 156/643 X R |
| 4,902,377 | 2/1990 | Berglund et al. | 156/643 |
| 4,968,374 | 11/1990 | Tsukada et al. | 204/298.31 X |

FOREIGN PATENT DOCUMENTS

| 3208826 | 9/1983 | Fed. Rep. of Germany | 204/298.34 |
| 0096277 | 6/1984 | Japan | 204/298.34 |

OTHER PUBLICATIONS

S. Bhattacharya, "System . . . Plasma Etching", IBM Techn. Dis. Bulletin, vol. 20, No. 3, Aug. 1977.

*Primary Examiner*—Nam Nguyen
*Attorney, Agent, or Firm*—Miriam Jackson; Stuart T. Langley

[57] ABSTRACT

A multi-tiered contact etch process comprising alternating anisotropic and isotropic etch steps is performed in a reactive ion etcher wherein DC bias on a cathode (11) of the etcher can be controlled independently from RF power, adding a great deal of control over isotropy of the etching. By shunting the cathode (11) directly to ground a high level of isotropy is achieved during isotropic etch steps. When the cathode (11) is not shunted to ground a bias voltage develops on the cathode (11) providing a highly anisotropic etching.

10 Claims, 3 Drawing Sheets

CONTROLLED ISOTROPY REACTIVE ION ETCHER FOR MULTI-STEPPED SLOPED CONTACT ETCH PROCESS

BACKGROUND OF THE INVENTION

The present invention relates, in general, to etch processes and, more particularly, to a sloped contact etch process and a controlled isotropy reactive ion etcher.

Semiconductor integrated circuits comprise a plurality of circuits and devices which are interconnected by one or more patterned metal layers, also called interconnect layers, formed on a top surface of the integrated circuit. The interconnect layers are separated from each other and the circuit by interlayer dielectric films. As device dimensions approach a sub-micron level, one limiting factor for further reduction in size is area required for device interconnections. A major component of interconnect area is size of contact windows and vias, which are etched in the interlayer dielectric. Contact windows are etched to expose portions of the underlying circuit or lower interconnect layer. An upper interconnect layer is formed on top of the interlayer dielectric and in contact with the underlying circuit or the lower interconnect layer through the contact window.

Etch processes are classified generally as isotropic or anisotropic. In either process, windows formed in a patterned masking layer define geometry of the contact window. Isotropic etch processes undercut the masking layer while vertically etching the dielectric layer. Anisotropic etch processes create vertical sidewalls with the top and bottom of the contact window having substantially the same dimensions as the windows formed in the masking layer. Isotropic etch processes are undesirable for sub-micron geometries because the undercut significantly increases lateral area required for the contact window. Although anisotropic etch processes are compatible with the sub-micron dimensions of contact windows, the vertical sidewalls results in a via which is difficult to fill when the upper interconnect layer is deposited.

Sloped contact etch processes using alternating steps of anisotropic etching and isotropic mask erosion are described in U.S. Pat. Nos. 4,902,377 and 4,698,128 issued to some of the inventors of the present invention and assigned to the same assignee as the present invention, and incorporated herein by reference. The isotropic mask erosion step increases size of the upper portion of the via while maintaining the original printed contact dimension at the lower portion of the via. It is highly desirable to perform such a multi-step etch process in a single piece of equipment to reduce handling and contamination.

A multi-step sloped contact etch process relies heavily on an ability to isotropically etch a masking layer in a reactive ion etcher. Reactive ion etchers are optimized, however, for anisotropic etching. In particular, hexode reactive ion etchers, such as an AME 8110 built by Applied Materials Corporation, have substantial asymmetry between cathode and anode surface areas which results in a high degree of anisotropy and limited ability to perform an isotropic etch. Also, reactive ion etchers develop a self-generated DC bias on the cathode which accelerates positive ions in the plasma towards substrates mounted on the cathode, further increasing anisotropy.

Limited isotropy in the multi-step sloped contact etch process results in excessive vertical photoresist erosion during the mask erosion step. Vertical photoresist erosion is combated by thicker photoresist masks and correspondingly larger printed contact geometries. If thinner resist is used to achieve small contact geometries, control over the slope of the via is reduced. What is needed is a reactive ion etcher which can be easily switched between isotropic etching and anisotropic etching modes.

SUMMARY OF THE INVENTION

Briefly stated, the advantages of the present invention are achieved by a multi-tiered contact etch process comprising alternating anisotropic and isotropic etch steps performed in a reactive ion etcher wherein DC bias on a cathode of the etcher can be controlled independently of applied RF power, adding a great deal of control over isotropy of the etching. Controlled isotropy is particularly useful during isotropic mask erosion steps in accordance with the method of the present invention.

As used herein, the terms "contact window" and "via" are used interchangably to mean holes etched in a dielectric layer to expose either an underlying semiconductor substrate or a previously formed conductive interconnect layer.

DETAILED DESCRIPTION OF THE DRAWINGS

As set out in the Background of the Invention, a controllable, repeatable sloped contact etch process is highly desirable for semiconductor devices. Conventional wet chemical etching, or for that matter any etching process which is purely isotropic, can produce sloped contact etch profiles but can not control contact dimensions adequately. Multi-tiered contact etch processes, as described in U.S. Pat. Nos. 4,902,377 and 4,698,128, use alternating anisotropic etch steps and isotropic mask erosion steps to produce a sloped contact. Optimal performance of a multi-tiered contact etch process is achieved by providing both highly anisotropic etching of a dielectric layer and highly isotropic etching of a mask layer using a single piece of equipment.

The present invention is described in terms of a contact etch process in which a hole is etched in a dielectric layer. It should be understood, however, that utility of the present invention is not limited to contact etch processes, and that a hole may be etched in non-dielectric films and materials using the method and apparatus of the present invention.

The present invention is particularly useful in batch reactive ion etchers where a number of semiconductor substrates are etched at one time. Batch etchers usually have cathode surface area which is less than half the anode surface area to promote anisotropic etching. Although reactive ion etch tools are optimized for anisotropic etching, the method and apparatus in accordance with the present invention allow a batch reactive ion etcher to etch highly isotropically. Although the present invention is described in terms of an AME 8110 batch etcher, almost any reactive ion etch tool may be modified in accordance with the present invention.

Figure 1A:
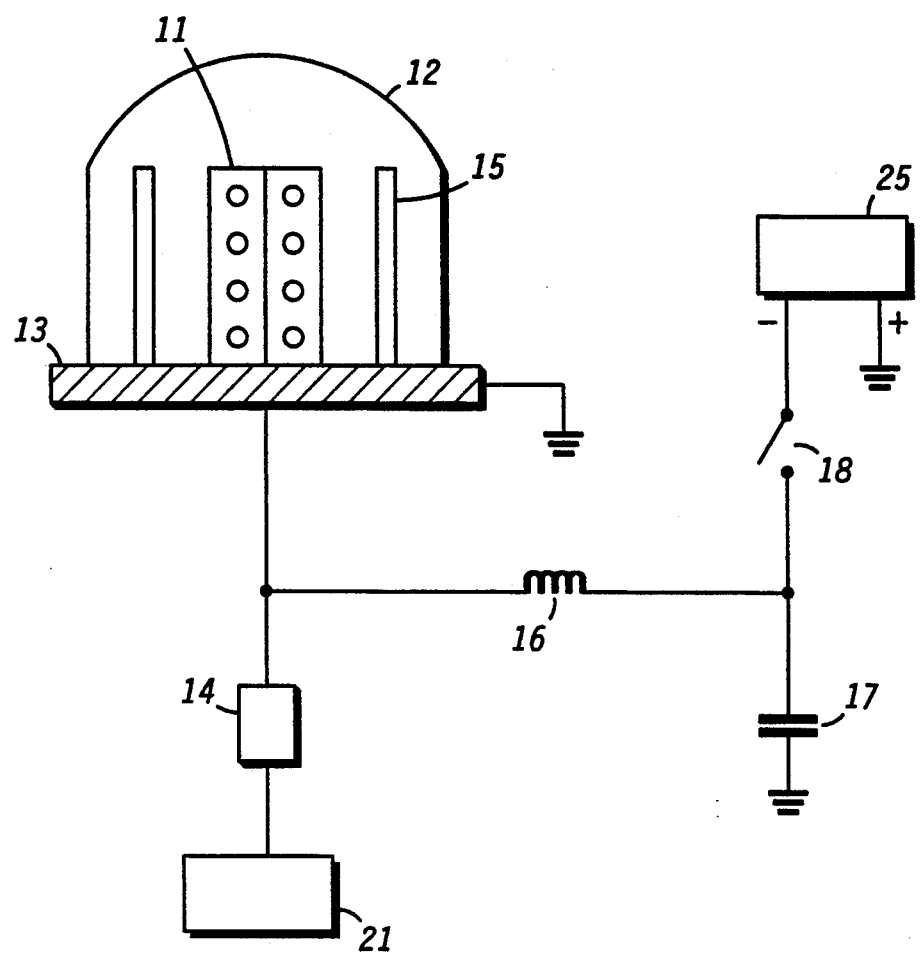
FIG. 1a illustrates a highly simplified schematic of a first reactive ion etcher in accordance with the present invention.

FIG. 1a illustrates a simplified schematic drawing of a first embodiment of a reactive ion etcher modified in accordance with the present invention. The reactive ion etcher comprises cathode 11 which is adapted to hold semiconductor substrates. Enclosing member 12 seals against base plate 13 to enclose a reaction chamber. Enclosing member 12 also serves as an anode, and is usually coupled to ground potential. Gas ports 15 are placed inside the reaction chamber and spaced from cathode 11. Gas ports 15 are conduits to introduce process gases into the reaction chamber. Typically, enclosing member 12 is bell-jar shaped and cathode 11 is hexode shaped and less than half the surface area of enclosing member 12.

Other etch tools are designed so that enclosing member 12 serves as a cathode and the electrode upon which the substrates are mounted serves as an anode. Still other varieties of etchers comprise a plurality of alternating metal plates, some of which are cathodes and some of which are anodes. The present invention can easily be adapted to such etchers.

Cathode 11 is coupled to RF matching unit 14 which is used to couple power from RF generator 21 to cathode 11. As set out hereinbefore, some etchers use enclosing member 12 as a cathode, in which case RF power would be coupled to enclosing member 12. RF generator 21 generates an RF field between cathode 11 and enclosing member 12, which serves an an anode in the preferred embodiment. Commonly, the RF signal is about 13.56 megahertz, although other frequencies may be used.

In accordance with the present invention, RF matching unit 14 and cathode 11 are coupled to a choke 16 which is coupled through a blocking capacitor 17 to ground. Choke 16 comprises an inductor sized to block the RF signal from RF generator 21 The ground connection is usually made to a frame (not shown) of the etcher which is coupled to earth ground. Enclosing member 12 and base plate 13 are also coupled to ground, in the preferred embodiment. Choke 16 and blocking capacitor 17 are also coupled to a negative terminal of a DC power supply 25 when switch 18 is closed. A positive terminal of DC power supply 25 is coupled to ground in the preferred embodiment. DC power supply 25 is preferably capable of generating a DC potential in excess of any self-generated DC bias which occurs during etching. Switch 18 may be a manual switch, but is preferably a relay or high power semiconductor switch so that switch 18 can be controlled automatically by control electronics which operated the etch tool.

Figure 1B:
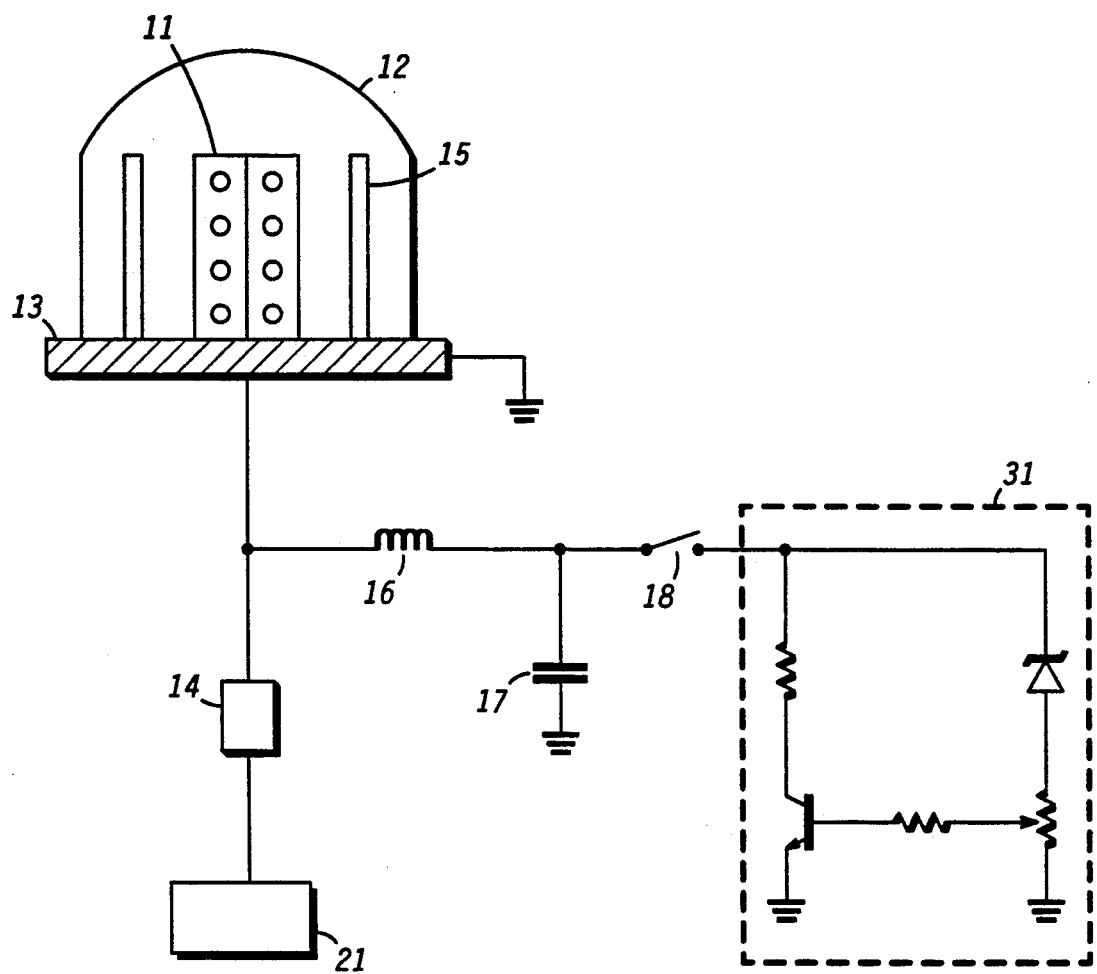
FIG. 1b illustrates a highly simplified schematic of a second reactive ion etcher in accordance with the present invention.

FIG. 1b illustrates a second embodiment reactive ion etcher which differs primarily from the embodiment shown in FIG. 1a in that power supply 25 is replaced by a DC voltage regulator circuit 31. Regulator 31 may comprise any of a number of well known shunt regulator circuit and so will not be described in detail for ease of description. Many other DC regulator circuits are known which provide controlled constant voltage or current, and so regulator 31 will not be described in detail. For example, an extremely simple regulator may be provided by a variable impedance (not shown) coupled between switch 18 and ground. A notable feature of the second embodiment is that regulator 31 is powered by the self-generated DC bias in the etch tool rather than by a separated power connection. This feature reduces complexity and size of the etcher.

Operation of the etchers described in FIG. 1a and FIG. 1b is similar. In operation, the reaction chamber is pumped down to a low pressure and process gases are introduced into the enclosure by gas ports 15. Normal operating pressure is less than 0.14 millimeters of mercury (mm Hg) for anisotropic reactive ion etching and 0.2 mm Hg for less anisotropic etching, for example. When RF generator 21 is activated, a plasma is created between cathode 11 and enclosing member 12. Reactive ion etchers are conventionally designed so that a self-generated DC bias develops on cathode 11. So long as switch 18 is open, magnitude of the self-generated DC bias is a function of magnitude of the RF signal between cathode 11 and enclosing member 12. This DC bias is usually considered desirable as it accelerates positive ions towards cathode 11 greatly improving anisotropic etch characteristics.

In the first embodiment, when switch 18 is closed, power supply 25 counteracts the self-generated DC bias. By setting power supply 25 at a higher voltage than the self-generated DC bias, cathode 11 can actually be made negative with respect to anode 12. In the second embodiment, when switch 18 is closed, a portion or all of the self-generated DC bias is shunted from cathode 11 to ground. In this manner, the DC potential on cathode 11 which is normally blocked by capacitor 17, can be controllable shunted to ground removing DC bias from cathode 11 altogether. This results in highly improved isotropy which can be controlled during an etch cycle.

Power supply 25 (FIG. 1a) or regulator 31 (FIG. 1b) are coupled in parallel with blocking capacitor 17 and are used to set a predetermined bias on cathode 11. In the past, magnitude of the self-bias on cathode 11 was controlled by amplitude modulation of the RF signal supplied by generator 21. Although this allowed some control over DC bias which developed on cathode 11, a great deal more process control is provided by power supply 25 or regulator 31 which allow independent control of DC bias and RF amplitude on cathode 11. Since RF amplitude also affects etching variables such as etch rate, a high RF amplitude may be used to improve etching while independently controlling DC bias on cathode 11 to achieve desired degree of isotropy.

FIGS. 2–5 illustrate magnified, simplified cross-sectional views of a portion of a semiconductor device made in accordance with the present invention at various stages of processing. It should be understood that utility of the present invention extends far beyond sloped contact etch processes, and may be used for forming vias in interlayer dielectrics or in any etch process where sidewall contour control is needed. Although illustrated in terms of etching a dielectric layer using a photoresist mask, other materials may be etched and other mask materials may be used. In fact, almost any material which can be etched in a plasma reactor can be used with the present invention by selecting a masking material and etch chemistry which is selective to the material to be etched.

Figure 2:
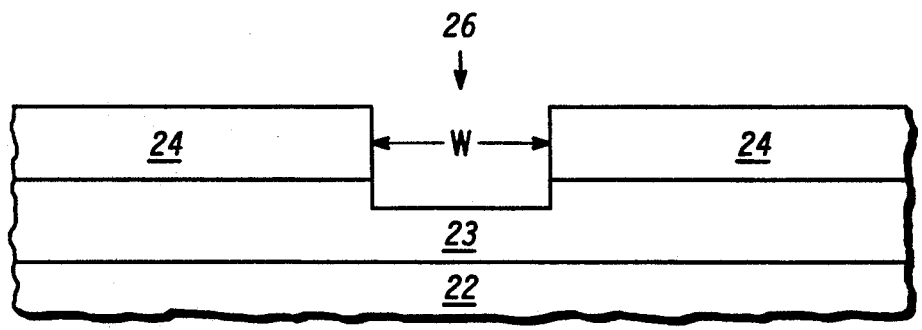
FIG. 2 illustrates a small portion of a semiconductor device illustrating a sloped contact etch process in accordance with the present invention at an early stage of processing.

FIG. 2 illustrates a layer 23 formed on a substrate 22 comprising a material such as silicon. If layer 23 is used as an interlayer dielectric, it may comprise silicon oxide, silicon nitride, polyimide, or the like. A mask layer 24, also referred to as masking film 24, is formed on layer 23 and patterned to provide a window 26 having a width W. Mask layer 24 comprises a material which is differentially etchable with respect to layer 23, such as photoresist, silicon nitride, polyimide, or the like. Material choice for mask layer 24 depends on material choice for layer 23. Width W is selected to be the desired contact area and is limited primarily by thickness of mask layer 24 and photolithography equipment used.

Once mask layer 24 is patterned, substrate 22 is mounted in the reactive ion etcher on cathode 11, shown in FIG. 1. For a contact etch process, the initial etch will be anisotropic. Relay 18, shown in FIG. 1, is open and self-bias is allowed to develop on cathode 11 to provide the anisotropic etch. A portion of layer 23 is removed forming a cavity in layer 23 as shown in FIG. 2. It is important to note that the etch chemistry used to etch layer 23 is highly selective to layer 23 and does not substantially reduce thickness of mask layer 24. The width of the cavity formed in layer 23 is substantially equal to width W of window 26.

Figure 3:
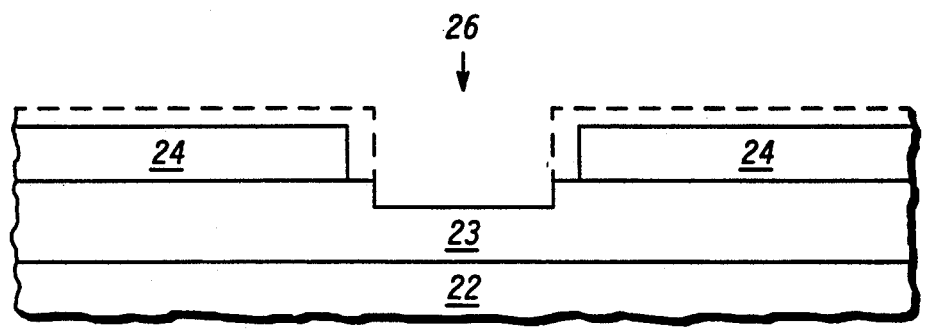
FIG. 3 illustrates the device shown in FIG. 2 further along in processing.

Once the initial anisotropic etch is completed, RF generator 21 is deactivated and gas chemistry and operating pressure are altered to perform an isotropic etch of mask layer 24, as shown in FIG. 3. Gas chemistry is altered to etch mask layer 24 selectively with respect to layer 23 and pressure usually increased to increase isotropy. Examples of gas chemistry, pressure, and power levels useful in both the anisotropic and isotropic etch modules of the present invention are described in greater detail in U.S. Pat. Nos. 4,902,377 and 4,698,128.

An important feature of the present invention is that switch 18 is closed during the isotropic etch module to short at least a portion of the self-generated DC bias voltage from cathode 11 to ground. Once switch 18 is closed and gas distribution and pressure within enclosing member 12 is stabilized, RF generator 21 is activated to apply power to cathode 11 and create an RF plasma. In contrast to the etching shown in FIG. 2, however, the etch of mask layer 24 is highly isotropic. The isotropic etch removes an equal or greater amount from the horizontal sidewalls as is removed in the vertical direction, as indicated by the dashed lines in FIG. 3. Ideally, the vertical component of the etch would be eliminated entirely, but present state of the art does not allow purely horizontal etching.

TABLE 1

| Photoresist Removal | Full Bias | Shunted Bias |
|---|---|---|
| Vertical Component | 995 Å/minute | 816 |
| Lateral Component | 700 | 900 |
| Removal Ratio (Lateral:Vertical) | 0.7:1 | 1.1:1 |

Table 1 illustrates experimental results on a sample structure similar to that shown in FIGS. 2-5. Both full bias and shunted bias data were taken under similar pressure and chemistry ambient within enclosing member 12. Experimental data were taken in a AME 8110 reactive ion etcher using a hexode shaped cathode. The full bias data column shows that, even using the techniques of high pressure and optimized gas chemistry, vertical etching occurs more rapidly than lateral etching. However, using the shunted bias method of the present invention the vertical component is reduced and the lateral component increased showing that a high degree of isotropy is achieved.

Advantages of improved isotropy are apparent. Because the vertical component of etch during the mask erosion step is greatly reduced, a thinner mask layer 24 may be used initially. Thinner mask layers allow width W of window 26 to be made smaller for a given set of photolithography conditions. Alternatively, if thickness of mask layer 24 is unchanged the higher lateral component of resist erosion allows greater slope in the sidewalls. The greater slope results in improved filling of the via with a metal layer.

Figure 4:
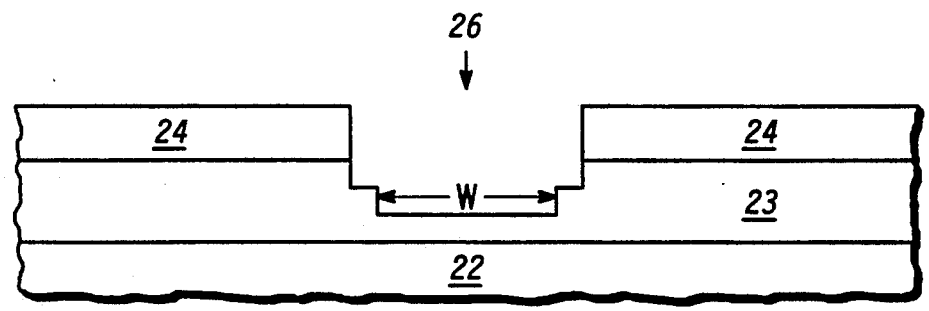
FIG. 4 illustrates the device shown in FIG. 3 further along in processing.

FIG. 4 illustrates a semiconductor contact further along in processing. The mask erosion step shown in FIG. 3 is followed by another anisotropic etch module similar to that described in reference to FIG. 2. Again, the RF plasma is removed, gas composition and pressure changed, and the reactor allowed to stabilize. Switch 18, shown in FIG. 1a and FIG. 1b, is again opened so that DC bias may develop on cathode 11. Once open, the RF power is reapplied to begin the etch process.

As shown in FIG. 4 a highly isotropic etch of layer 23 is then performed creating a multi-tiered sidewall with a controlled slope. It is important to note that dimension W defined originally by the mask opening 26, remains the dimension of the base of the contact opening. This is important in that sub-micron dimensions can be translated down towards substrate 22 while controllably widening the upper portion of the contact opening.

Figure 5:
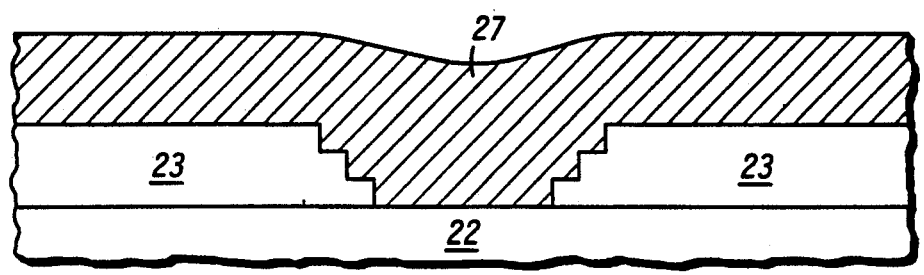
FIG. 5 illustrates the device shown in FIG. 4 at a late stage in processing.

In accordance with the present invention, anisotropic oxide etches are alternated with highly isotropic mask erosion steps to provide a multi-tiered sidewall having a base opening of width W, equal to the original width of the opening printed in photoresist 24. The profile of the contact or via sidewall is controlled by the length and number of tier steps which comprise the sidewall. The number of tier steps which can be produced is determined by photoresist thickness and the length of each etch and mask erosion cycle. As shown in FIG. 5 the alternating steps are repeated to produce a multi-tiered sidewall reaching downward to the surface of substrate 22. The sloped contact opening is then filled with an interconnect material, usually a metal. Because sidewall profile is carefully controlled, the contact opening can usually be filled very completely with little voiding in metal layer 27.

Using the present invention, multiple step etch processes can be performed in a single reactor by providing a mode in which a normally anisotropic etcher can etch highly isotropically. By performing the etch in a single piece of equipment, process cycle time is reduced tremendously, and product quality improved due to elimination of contaminants and excess handling. The modified reactive ion etcher in accordance with the present invention provides independent control over cathode bias and RF power greatly improving process control over isotropy of the etch.

We claim:

1. A controlled isotropy reactive ion etcher comprising: a reaction chamber having a cathode and an anode, wherein one of the cathode and anode is adapted to hold semiconductor substrates; a means for generating an RF plasma between the cathode nd the anode; a means for supplying process gasses to the reaction chamber; a means for removing product gasses from the reaction chamber; and a means for controlling DC bias between the cathode and anode which is controlled independently of the means for generating an RF plasma, wherein the RF plasma creates a self-generated DC bias between the cathode and anode and the means for controlling DC bias comprises a shunt regulator coupled to the cathode for shunting at least a portion of the shelf generated DC bias to ground.

2. The etcher of claim 1 further comprising: an RF match unit coupled between the cathode and the means for generating an RF plasma; a choke coupled to the cathode; a blocking capacitor having a first terminal coupled to the choke and second terminal coupled to ground; and a switch coupled of the first terminal of the capacitor and to the means for controlling DC bias, wherein when the switch is close the means for controlling DC bias is coupled in parallel with the blocking capacitor thereby bypassing the blocking capacitor.

3. The etcher of claim 1 wherein surface area of the anode is at least twice as large as surface area of the cathode.

4. A controlled isotropy reactive ion etcher comprising: a base plate coupled to ground potential; an enclosing member coupled to ground potential, wherein the enclosing member seals against the base plate of from a reaction chamber and the enclosing member is an anode; a cathode inside the reaction chamber and electrically isolated from the enclosing member and the base plate, wherein the cathode holds a plurality of semiconductor substrates; gas ports within the reaction chamber spaced from the cathode; an RF matching network coupled in series with the cathode; an RF signal generator coupled of ground and to the Rf matching network, wherein an RF signal generated by the RF signal generator passes through the RF matching network to the cathode; a choke having a first terminal coupled to the cathode and a second terminal; a blocking capacitor having a first terminal coupled to the second terminal of the choke, and a second terminal coupled to ground; a relay coupled to ground potential and coupled in parallel with the blocking capacitor; and a shunt regulator coupled to the relay.

5. The controlled isotropy reactive ion etcher of claim 4 wherein the RF signal is approximately 13.56 megahertz.

6. A sloped contact etch process for forming a hole in a layer formed on a semiconductor substrate comprising the steps of: providing a semiconductor substrate; providing a dielectric layer on the semiconductor substrate; forming a patterned masking film on the surface of the dielectric layer; providing a reactive ion etcher having a cathode, an anode, and a reaction chamber; placing the semiconductor substrate on the cathode in the reaction chamber; creating an RF plasma between the cathode and anode; anisotropic etching the dielectric layer with a DC bias on the cathode; isotropic etching the masking film with reduced DC bias on the cathode; and etching the dielectric layer with a DC bias on the cathode at least once after the step of etching the masking film.

7. The method of claim 6 wherein the masking film comprises photoresist.

8. The method of claim 6 wherein the step of etching the layer is performed with the reaction chamber at a lower pressure than the sep of etching the masking film.

9. The method of claim 6 wherein the step of etching the masking film further comprises etching a vertical component of the masking film and etching a horizontal component of the masking film, wherein the vertical and horizontal components are substantially equal.

10. A method of controlling isotropy in a reactive ion etcher comprising: providing a hexode reactive ion etcher having a hexode shaped cathode, wherein the cathode self-biases with a DC voltage during operation; and shunting at least a portion of the self-bias DC voltage to ground during operation to perform isotropic etching.

* * * * *

UNITED STATES PATENT AND TRADEMARK OFFICE
CERTIFICATE OF CORRECTION

PATENT NO. : 5,250,165

DATED : October 5, 1993

INVENTOR(S) : Robert Berglund et al.

It is certified that error appears in the above-identified patent and that said Letters Patent is hereby corrected as shown below:

```
Column 7, claim 1, line 5, change "nd" to --and--.
Column 7, claim 2, line 21, change "of", first occurrence, to --to--.
Column 7, claim 2, line 24, change "close" to --closed--.
Column 7, claim 4, line 32, change "of from" to --to form--.
Column 7, claim 4, line 40, change "of" to --to--.
Column 7, claim 4, line 40, change "Rf" to --RF--.
Column 8, claim 8, line 30, change "sep" to --step--.
```

Signed and Sealed this

Fifth Day of July, 1994

Attest:

BRUCE LEHMAN

*Attesting Officer*   *Commissioner of Patents and Trademarks*